(12) United States Patent
Correale, Jr. et al.

(10) Patent No.: US 8,188,516 B2
(45) Date of Patent: May 29, 2012

(54) CREATING INTEGRATED CIRCUIT CAPACITANCE FROM GATE ARRAY STRUCTURES

(75) Inventors: Anthony Correale, Jr., Raleigh, NC (US); Benjamin J. Bowers, Cary, NC (US); Douglass T. Lamb, Cary, NC (US); Nishith Rohatgi, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 12/717,605

(22) Filed: Mar. 4, 2010

(65) Prior Publication Data

US 2010/0155800 A1 Jun. 24, 2010

Related U.S. Application Data

(63) Continuation of application No. 11/337,010, filed on Jan. 20, 2006, now Pat. No. 7,728,362.

(51) Int. Cl.
*H01L 27/10* (2006.01)
*H01L 23/52* (2006.01)

(52) U.S. Cl. ........ 257/207; 257/206; 257/208; 257/313; 257/E23.142

(58) Field of Classification Search .................. 257/202, 257/204, 206–210, 313, 665, E23.142, E23.153
See application file for complete search history.

(56) References Cited

U.S. PATENT DOCUMENTS

| | | |
|---|---|---|
| 4,453,090 A | 6/1984 | Sempel |
| 4,626,881 A | 12/1986 | Kishi et al. |
| 4,783,692 A | 11/1988 | Uratani |
| 4,786,828 A | 11/1988 | Hoffman |
| 5,266,821 A | 11/1993 | Chern et al. |
| 5,576,565 A | 11/1996 | Yamaguchi et al. |
| 5,780,930 A | 7/1998 | Malladi et al. |
| 5,910,010 A | 6/1999 | Nishizawa et al. |
| 6,020,616 A | 2/2000 | Bothra et al. |
| 6,285,052 B1 | 9/2001 | Draper |
| 6,327,695 B1 | 12/2001 | Bothra et al. |
| 6,507,497 B2 | 1/2003 | Mashino |
| 6,548,338 B2 | 4/2003 | Bernstein et al. |
| 6,670,692 B1 | 12/2003 | Shih et al. |
| 6,700,771 B2 | 3/2004 | Bhattacharyya |
| 6,721,153 B2 | 4/2004 | Naito et al. |
| 6,735,072 B2 | 5/2004 | Liao |
| 6,768,650 B2 | 7/2004 | Devey |
| 6,791,127 B2 | 9/2004 | Nunokawa |

(Continued)

FOREIGN PATENT DOCUMENTS

JP 59054248 A 3/1984

(Continued)

*Primary Examiner* — David Vu
*Assistant Examiner* — Earl Taylor
(74) *Attorney, Agent, or Firm* — Ian D. MacKinnon; Khanh Tran

(57) ABSTRACT

Techniques for using gate arrays to create capacitive structures within an integrated circuit are disclosed. Embodiments comprise placing a gate array of P-type field effect transistors (P-fets) and N-type field effect transistors (N-fets) in an integrated circuit design, coupling drains and sources for one or more P-fets and gates for one or more N-fets to a power supply ground, and coupling gates for the one or more P-fets and the drains and sources for one or more N-fets to a positive voltage of the power supply. In some embodiments, source-to-drain leakage current for capacitive apparatuses of P-fets and N-fets are minimized by biasing one or more P-fets and one or more N-fets to the positive voltage and the ground, respectively. In other embodiments, the capacitive structures may be implemented using fusible elements to isolate the capacitive structures in case of shorts.

15 Claims, 12 Drawing Sheets

U.S. PATENT DOCUMENTS

| | | |
|---|---|---|
| 6,875,921 B1 | 4/2005 | Conn |
| 2001/0039079 A1 | 11/2001 | Shin |
| 2004/0133868 A1 | 7/2004 | Ichimiya |
| 2005/0116268 A1 | 6/2005 | Tahira et al. |
| 2005/0269619 A1 | 12/2005 | Shor et al. |
| 2005/0280084 A1 | 12/2005 | Morishita et al. |

FOREIGN PATENT DOCUMENTS

| | | |
|---|---|---|
| JP | 1065863 A | 3/1989 |
| JP | 8213776 A | 8/1996 |
| JP | 10012825 A | 1/1998 |
| JP | 11204766 A | 7/1999 |
| JP | 2004071837 A | 5/2004 |
| WO | WO03044854 A1 | 1/2005 |

LEGEND FOR FIG 1D

P-DIFFUSION  N-DIFFUSION
POLYSILICON  VDD  GROUND  N-FET

LEGEND FOR FIGS 2A & 2B

P-DIFFUSION  N-DIFFUSION

POLYSILICON  VDD  GROUND  N-FET

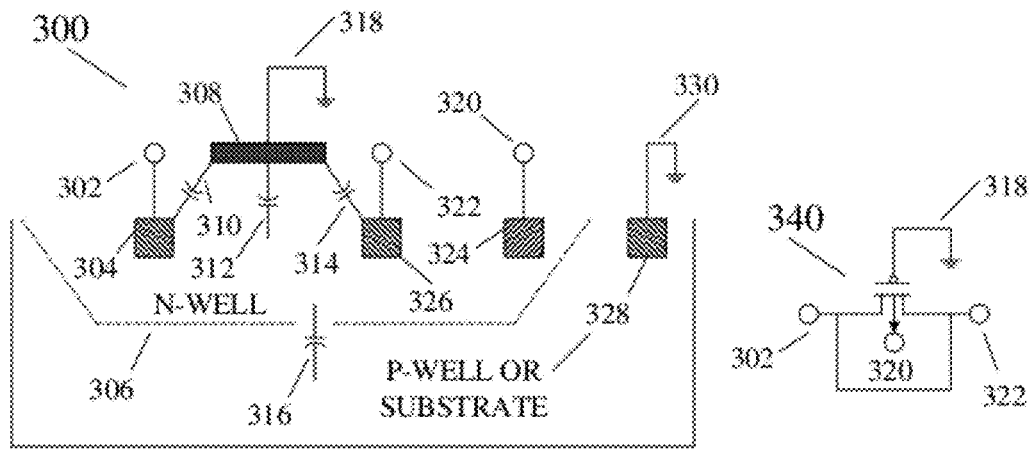
FIG 3A
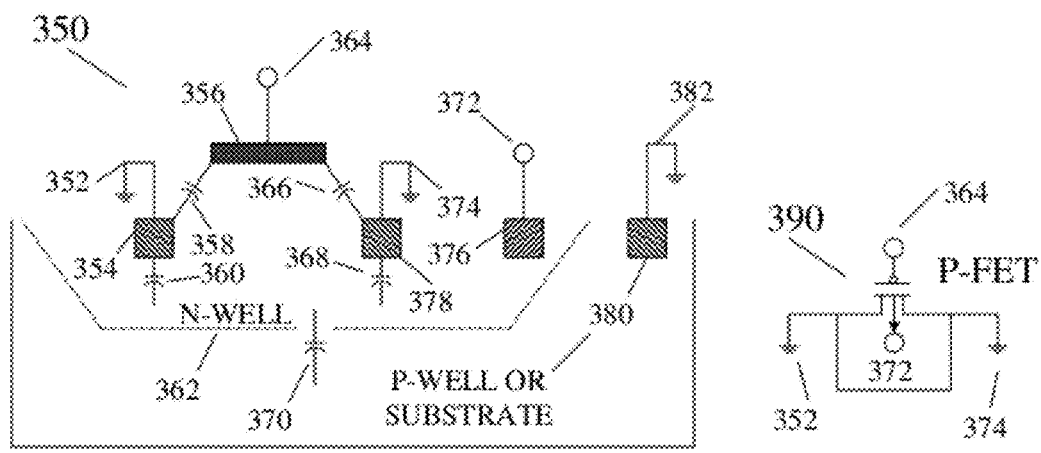
FIG 3B
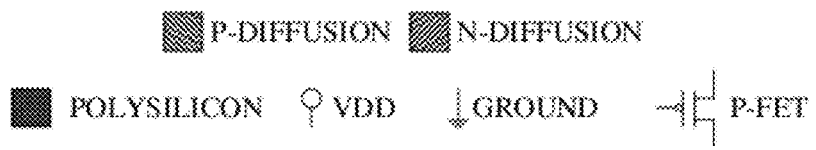

CREATING INTEGRATED CIRCUIT CAPACITANCE FROM GATE ARRAY STRUCTURES

CROSS-REFERENCES TO RELATED APPLICATIONS

Pursuant to 35 USC §120, this continuation application claims priority to and benefit of U.S. patent application Ser. No. 11/337,010, entitled "METHODS AND APPARATUSES FOR CREATING INTEGRATED CIRCUIT CAPACITANCE FROM GATE ARRAY STRUCTURES", filed Jan. 20, 2006, the disclosure of which is incorporated herein in its entirety for all purposes.

FIELD

The present invention generally relates to the field of integrated circuits. More particularly, the present invention relates to providing capacitance to integrated circuits from gate array structures formed in a semiconductor substrate.

BACKGROUND

Today, integrated circuits ("ICs") may contain millions of transistors on a single chip, with many critical circuit features having measurements in the deep sub-micron range. ICs are fabricated layer by layer on a semiconductor substrate. Using techniques known in the art of semiconductor fabrication, metal-oxide-semiconductor ("MOS") transistors, bipolar transistors, diodes and other devices are fabricated and combined to form an IC on a substrate. Typically, portions of some of the devices and some interconnections are frequently formed using one or more levels of polysilicon. For example, a MOS transistor gate electrode and a resistor may be fabricated from a layer of polysilicon.

The IC layers are fabricated through a sequence of pattern definition steps that are mixed with other process steps such as oxidation, etching, doping, and material deposition. One or more metal layers are then deposited on top of the base layers to form conductive segments that interconnect IC components. Formation of the metallization layers over the substrate facilitates interconnection of the transistors to form more complex devices such as NAND gates, inverters, and the like. These metallization layers may also be used to provide power supply ground ($V_{SS}$) and power supply voltage ($V_{DD}$) to such IC devices.

The metallization layers utilize lines, contacts, and vias to interconnect the transistors in each of the cells as well as to interconnect the cells to form the integrated circuit, such as a processor, state machine, or memory. Lines in adjacent vertical layers often run perpendicular to one another, the adjacent vertical layers separated by a non-conductive passivation layer such as, e.g., silicon oxide. The silicon oxide is etched to form the vias, which interconnect the lines of various metallization layers in accordance with the circuit design. Inputs and outputs of the integrated circuit are brought to a surface with vias to bond the circuits with pins of a chip package. The chip package typically includes an epoxy or ceramic that encloses the integrated circuit to protect the circuit from damage and pins to facilitate a connection between the inputs and outputs of the integrated circuit and, e.g., a printed circuit board.

As stated above, the finished product IC may contain millions of transistors. Many of these transistors may operate with rapid switching rates. The operation of low-power, high-speed integrated circuits may be affected by these rapid switching rates. The extremely rapid switching rates of the transistor and other discrete components that make up integrated circuits typically cause current transients in the power buses of the integrated circuits. These current transients may last for several nanoseconds. Unfortunately, the power supply for the circuit may require much more time, such as several microseconds, to compensate for the transient currents drawn from the power bus by the discrete components. As a consequence, these transient currents from the power bus cause noise in power supply rails. Low gate threshold voltages of the various discrete components in ICs require the power supply bus to deliver a stable voltage, with minimum voltage level variations. Consequently, power supply bus stability, in terms of current response and voltage level fluctuation, is a significant issue in the design of an integrated circuit.

The conventional approach for stabilizing the power supply bus is to insert decoupling capacitors between the power supply bus and the IC circuit elements. Decoupling capacitors placed near power consuming circuits tend to stabilize, or smooth out, voltage variations by utilizing the charge stored within the decoupling capacitor. The stored charge may be thought of as a local power supply, providing power during the times that the discrete components switch rapidly. The net result being that the decoupling capacitors help mitigate the effects of voltage noise induced onto the system power supply bus.

Generally, IC designers may incorporate decoupling capacitance directly on the IC by only a few means, such as using thin oxide capacitance, metal-to-metal capacitance, and junction capacitance. While thin oxide capacitance, such as that associated with device gate oxide, offers the highest capacitance per unit area, it also has higher gate leakage and tends to lower IC fabrication yield due to gate oxide shorts than the other capacitance options.

Today, gate oxide thickness of ICs is merely a few layers of atoms and is approaching fundamental limits. For example, in a typical complimentary metal-oxide-semiconductor (CMOS) device the gate oxide thickness is often less than two nanometers. Consequently, such a small thickness makes the device susceptible to the effects of gate leakage current from other circuit components coupled with the device. One example is gate tunneling leakage current generated by one or more decoupling capacitors that couple the device to the power bus. Another example is a gate oxide defect causing a short between two plates. Small holes, or other defects in the oxide, often result in gate oxide leakage currents.

Typically, thin oxide structures used to create decoupling capacitance are field effect transistor (fet) based devices with wide device widths and relatively long channels. These structures are generally interspersed with the logic gates of the IC circuit design. Vacant regions of an IC may also be populated with gate array back fill cells, to allow designers to satisfy pattern density requirements and allow engineers to incorporate design changes. Unfortunately, the precise need for decoupling capacitance is not known until the IC circuit design has been placed and routed. Decoupling capacitance needs may disrupt the design process, requiring designers and engineers to rearrange the initial circuit placement to accommodate insertion of the decoupling capacitance structures.

Using deep sub-micron technology to design ICs, combined with the strict need for minimizing leakage currents and the need to have adequate amounts of decoupling capacitance, presents circuit designers with numerous design problems. What is needed is a new apparatus for creating decoupling capacitance using gate array cells while minimizing yield losses due to gate oxide defects, leakage current, and placement disruption.

SUMMARY

The problems identified above are in large part addressed by methods and apparatuses for creating integrated circuit capacitance from gate array structures. One embodiment comprises a method for creating capacitance, such as decoupling capacitance, from a gate array containing numerous P-fets and N-fets in an integrated circuit using one or more modified gate array cells. The method generally involves placing unmodified cells in a circuit design, coupling the gates of the P-fets to a positive voltage power supply, and coupling the sources and drains of the P-fets to a ground of the voltage power supply to create a capacitive structure. Capacitive structures may also be created and isolated using a number of the gate array N-fets in other embodiments of the method.

In another embodiment, creating the integrated circuit capacitance may involve using N-fets in a P-well. In other embodiments, the integrated circuit capacitance may involve using P-fets in an N-well on a substrate. The capacitive N-fets structures may be created by coupling a number of the gate array N-fet sources and drains to a positive voltage power supply and coupling the number of corresponding gates of the N-fets to ground. Creating the capacitive P-fet structures may be similarly created by coupling a number of P-fet source and drain connections to a power supply ground, connecting the number of P-fet gates and the N-well to a positive voltage power supply, and coupling the substrate to the power supply ground.

In another embodiment, the capacitive P-fet structures may be isolated from the rest of the integrated circuit by placing one or more P-fets, with the transistors being turned off by appropriate biasing of their gates, in series with the capacitive P-fet structures. Inserting the isolating P-fets in this manner may help reduce the negative effects of gate oxide defects and leakage currents.

In further embodiments, the capacitive N-fet structures may be isolated from the rest of the integrated circuit by placing one or more N-fets, with the transistors being turned off by coupling their gates to ground, in series with the capacitive N-fet structures. In even further embodiments, the capacitive N-fet and P-fet structures may be interconnected in a manner to create a fusible link that may protect the structures from manufacturing shorts in gate array structures.

BRIEF DESCRIPTION OF THE DRAWINGS

Advantages of the invention will become apparent upon reading the following detailed description and upon reference to the accompanying drawings in which, like references may indicate similar elements:

FIGS. 3A-3B illustrates two configurations and associated schematics for creating capacitive structures from using P-fets in an N-well;

DETAILED DESCRIPTION OF EMBODIMENTS

Figure 1A:
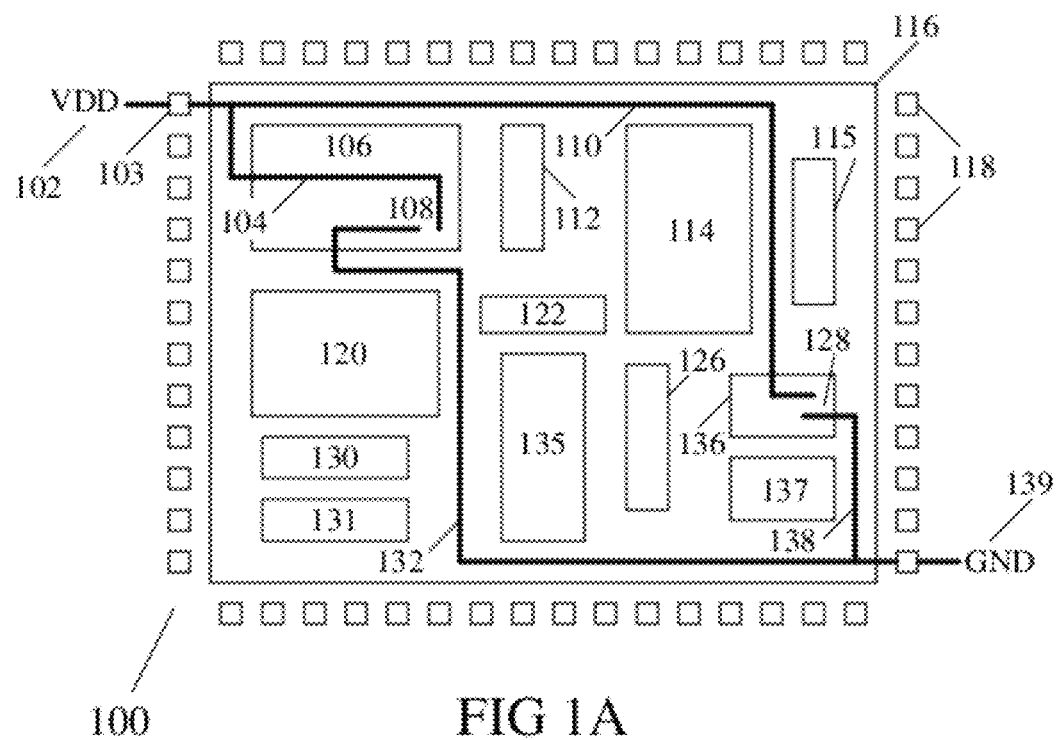
FIG. 1A depicts an ASIC system with a CPU, RAM, I/O blocks, D/A and A/D converters, and various gate arrays.

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and apparatuses for creating integrated circuit (IC) capacitance from gate array structures are discussed. New techniques for creating decoupling capacitance from gate arrays and structures within gate array cells formed in a semiconductor substrate of an integrated circuit are discussed. Embodiments comprise various gate array elements configured in different manners to provide capacitance for an integrated circuit. In one embodiment, numerous structures within a gate array cell, which could be configured to create N-type field effect transistors (N-fets) in a P-type diffusion well (P-well), are instead configured to create a capacitive element that can be used as a decoupling capacitor for the integrated circuit. Additionally, the embodiment may also contain numerous other structures within the gate array cell, which could otherwise be configured to create P-type field effect transistors (P-fets) in an N-type diffusion well (N-well), that are also configured to create a capacitive element.

In alternative embodiments, structures within a gate array cell are configured to create enhanced capacitive elements. These enhanced capacitive elements may have the additional benefit of minimizing yield losses resulting from gate oxide defects. In even further alternative embodiments, structures within a gate array cell are configured to create capacitive elements which may not only minimize yield losses from gate oxide defects, but may also minimize drain-source leakage associated with isolation devices.

While portions of the following detailed discussion describe many embodiments enabling one to create new capacitive structures from gate arrays for decoupling use within integrated circuits, upon review of the teachings herein, a person of ordinary skill in the art will recognize that the following invention may be practiced in a variety of ways, such as creating capacitance for other integrated circuit needs, unrelated to decoupling. All methods of practicing the invention are interchangeable for such different purposes. Further, while descriptions of embodiments may show how to create capacitance from polycrystalline silicon gate structures, and silicon substrates, one of ordinary skill in the art may use clever metal arrangements to create additional capacitance to the capacitive gate array structures. Additionally, one may substitute other materials in these structures when employed in accordance with the discussed embodiments and perform substantially equivalent functions.

Using gate arrays, or uncommitted logic arrays, is one approach for designing and manufacturing application-specific integrated circuits (ASICS). Gate array structures may be prefabricated structures with no particular function in which transistors, standard logic gates, and other active devices are placed at regular predefined positions and manufactured on a wafer. Creation of a circuit with a specified function may be accomplished by adding metal interconnects to the prefabricated gate array structures, allowing the function of the gate array to be customized as needed.

Integrated circuit engineers and designers may generally place uncommitted gate array cells at numerous places in a circuit design. Doing so may enable the engineers and designers to make design changes at a later stage in the manufacturing process without having to alter the circuit mask and circuit die. The gate arrays may fill what would otherwise be empty substrate areas in order to satisfy manufacturing surface spacing and pattern density requirements. As noted above, these gate arrays may also be customized to add transistors, logic gates, and other circuit components, such as resistors and capacitors, to the integrated circuit.

Turning to the drawings, FIG. 1A illustrates how a system 100 may benefit from methods and apparatuses for creating capacitance from gate array structures. As depicted in FIG. 1A, system 100 may be an ASIC created using a semiconductor substrate 116. System 100 may be divided into numerous functional areas and comprise numerous components, such as a central processing unit (CPU) 106, random access memory 114, cache 122, peripheral input-output 120, and an input-output (I/O) block 135. System 100 may comprise components for translating digital and analog signals, such as an analog-to-digital (A/D) converter 137 and a digital-to-analog (D/A) converter 136. For example, system 100 may be an ASIC for a cellular telephone, with A/D converter 137 and D/A converter 136 translating analog signals to and from a speaker and a microphone of the cellular telephone.

System 100 may also comprise numerous gate arrays located in various areas of the integrated circuit, such as gate array 112, gate array 126, as well as gate arrays 130, 131, and 115. Such gate arrays may be used in the ASIC to perform simple computations or logic functions outside the CPU 106, working in conjunction with other blocks, such as peripheral input-output block 120 or I/O block 135. Additionally, some or all of such gate arrays may comprise uncommitted gate array cells added to enable engineers to make design changes or to fill empty integrated circuit surface areas.

Numerous I/O pads 118 may be located around the periphery of semiconductor substrate 116, providing connection terminals for outside power and signal lines to system 100. As depicted in FIG. 1A, a power supply system voltage VDD 102 may be terminated on I/O pad 103 and be distributed throughout system 100 by numerous metal traces. For example, metal trace 104 may supply system voltage VDD 102 to the CPU 106 and metal trace 110 may supply system voltage VDD 102 to the D/A converter 136. Likewise, a system ground 139 may be terminated and distributed to the D/A converter 136 and the CPU 106 by metal trace 138 and metal trace 132, respectively.

System 100 may have transistors that operate at very high frequencies, to the extent that operating system 100 at these frequencies causes current transients, or noise, in the voltage power supply lines, such as metal traces 104, 110, 132, and 138. Additionally, this noise may be of such magnitude or frequency to cause logic errors in one or more system 100 components. For example, the noise may cause logic errors in a section 108 of the CPU 106 and in a section 128 of the D/A converter 136. A circuit designer may stabilize the power supply and reduce the noise by inserting decoupling capacitors near the affected IC components, in parallel with the components. The designer may incorporate decoupling capacitance directly in the IC by using one or more existing unused gate array structures. In FIG. 1A gate array 112 sits in close proximity to the CPU 106 while gate array 115 resides close to the D/A converter 136, both of which may be used to create decoupling capacitance.

Figure 1B:
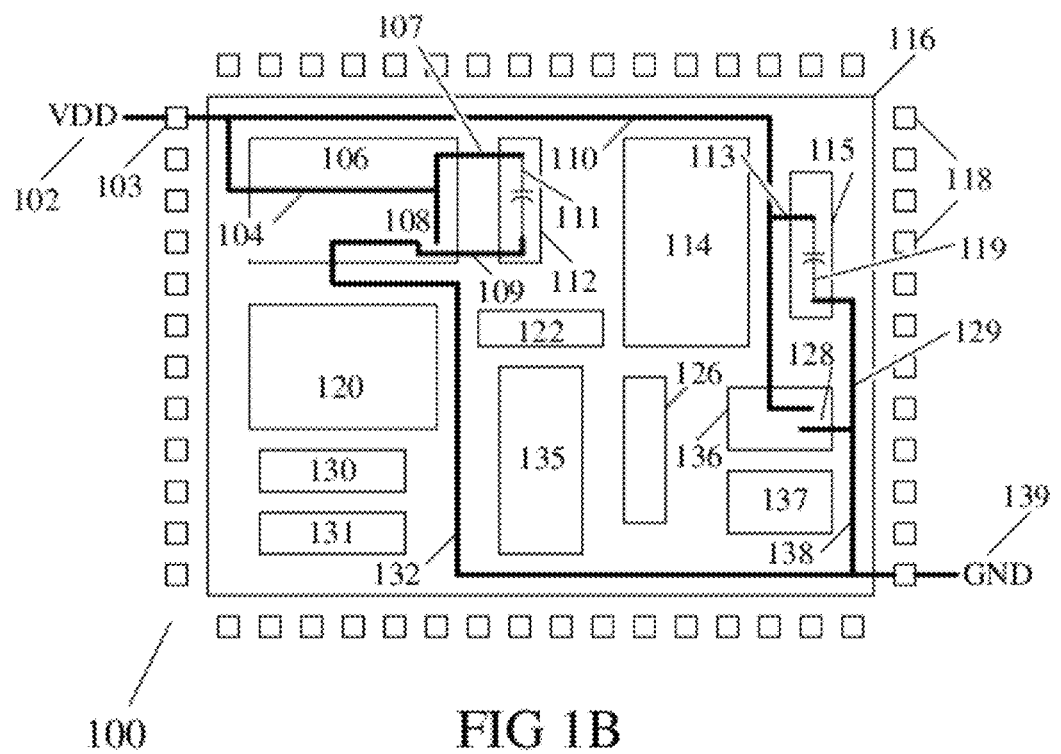
FIG. 1B depicts an ASIC system with two gate arrays modified to create capacitance.

FIG. 1B illustrates how previously uncommitted or partially unused structures within gate arrays 112 and 115 may be modified to create capacitance, according to various embodiments, and help reduce noise created on power supply metal traces 104, 110, 138, and 132. Note that gate array 112 may be modified to create a decoupling capacitor 111, connected in parallel to the power metal traces 104 and 132 by way of new metal traces 107 and 109, respectively. Creating such decoupling capacitance may attenuate the problem-causing noise in the power being supplied to section 108 of the CPU 106. Similarly, gate array 115 may be arranged to provide decoupling capacitance 119 for power metal traces 110 and 138 via new metal traces 113 and 129, respectively. Decoupling capacitance 119 connected in this manner may reduce the effects of noise in section 128 of D/A converter 136.

Generally, power and ground distributions, similar to those depicted in FIG. 1A and FIG. 1B, may form an interleaved matrix of wiring and allow access to various circuit functions, including non-personalized or unconfigured gate array cells. Configuring a gate array cell to implement a decoupling capacitor may require adding additional metal and contacts to access an existing power grid. Additionally, some non-personalized gate array cells may be amorphous, in that they are used to fill otherwise unused regions of a chip. Such non-personalized gate array cells may be transformed into design for manufacturability decoupling capacitors using back-end-of-line (BEOL) techniques. In other words, the non-personalized or previously unconfigured gate array cells may be modified to create capacitance at a very late stage in the design process.

In some embodiments, system 100 may be a CPU. In further embodiments, system 100 may comprise a microcontroller or another type of integrated circuit. Additionally, in other embodiments single or multiple parts of the integrated circuit may benefit from capacitance created from one or more gate arrays. Also, different embodiments may not necessarily have the capacitance gate arrays located immediately adjacent to the parts requiring capacitance. Gate array capacitors may be located throughout the system 100. In order to understand how such gate array capacitors may be configured to supply capacitance to an integrated circuit, we turn now to FIG. 1C.

Figure 1C:
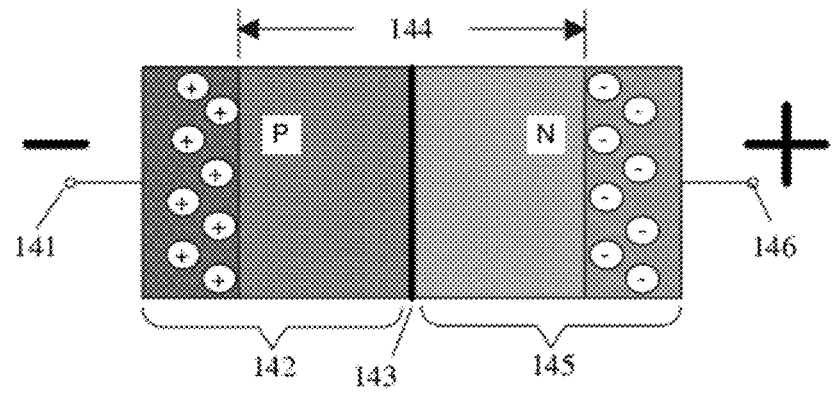
FIG. 1C illustrates how a semiconductor may be configured to function as a capacitor.

FIG. 1C illustrates one way a simple semiconductor apparatus may be configured to function as a capacitor. In FIG. 1C, a P-type material 142 and an N-type material 145 are coupled together, forming a P-N junction 143. If a positive voltage is applied to a terminal 146 of the N-type material 145, the voltage being positive with respect to a voltage at terminal 141 of the P-type material 142, the P-N junction 143 becomes reversed-biased. In the reverse-biased state, charged particles in both the P-type material 142 and N-type material 145 move away from the P-N junction 143 and increase the size of the associated depletion region 144. This condition may produce a high resistance between terminals 141 and 146, allowing a relatively small amount of current flow. Consequently, this depletion region 144 may serve as an insulation gap, functioning similar to a layer of dielectric material between the plates of a capacitor, and store energy in the outermost portions of the P-type material 142 and N-type material 145 as illustrated in FIG. 1C.

The technique for creating capacitance in a semiconductor apparatus shown in FIG. 1C may be employed in various embodiments. Alternatively, in other embodiments, different techniques may be employed to create capacitance in a semiconductor apparatus. For example, instead of simply using a two-terminal P-N junction, one embodiment may employ a three-terminal P-N-P device. Alternatively, another embodiment may employ a three-terminal N-P-N device. Similarly, other embodiments may employ various combinations of materials, such as polysilicon, metal, and oxide. A few variations of such combinations are discussed in the following figures.

Figure 1D:
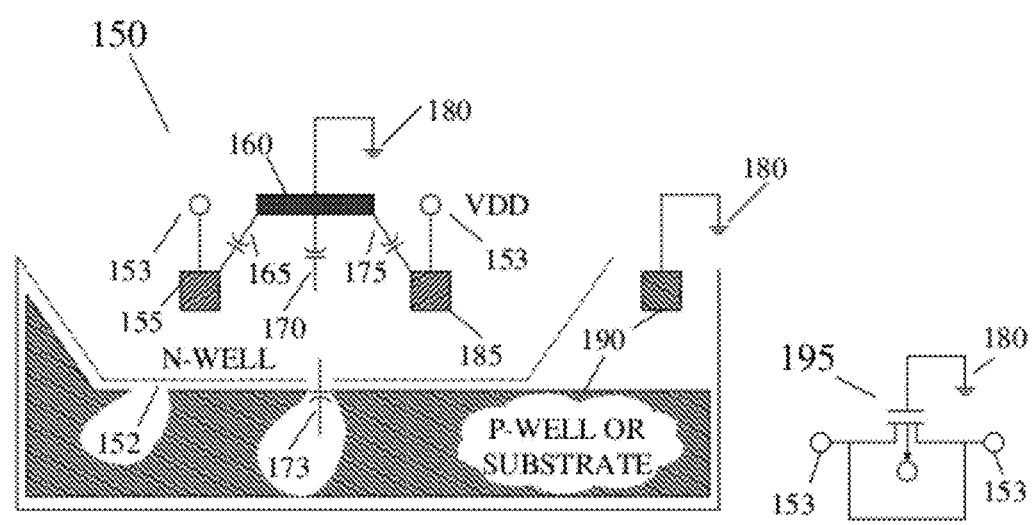
FIG. 1D depicts schematics for creating a capacitor from an N-fet in an N-well.

FIG. 1D illustrates an apparatus that may create capacitance from one section of a semiconductor substrate. A decoupling capacitor 150 may be constructed from an N-fet in an N-well 152. N-well 152 may be situated in a P-well or substrate region 190, of a semiconductor wafer. Note that P-well or substrate region 190 surrounds N-well 152 in FIG. 1D. Further, note that the N-fet in N-well 152 may not be a configuration employed in some gate array cell structures. P-fets may be crafted within N-wells, similar to N-well 152, and N-fets may be crafted in P-wells or substrates.

An N-type diffusion area 155, is biased to a power supply voltage $V_{DD}$ 153. Similarly, an N-type diffusion area 185, is also biased to power supply voltage $V_{DD}$ 153. Polysilicon material 160, which may be considered a gate connection for the N-fet, may be connected to a ground 180. The P-well or substrate region 190 may also be connected to ground 180. In other words, N-type diffusion areas 155 and 185 may be biased to power supply voltage $V_{DD}$ 153 while polysilicon material 160 and the P-well or substrate region 190 are connected to the power supply ground. FIG. 1D also depicts what may be an analogous schematic representation 195 of the N-fet structure in an N-well configured to create a capacitive structure.

Connecting one transistor in this manner creates capacitance 165 between source N-type diffusion area 155 and gate polysilicon material 160. This source-to-gate capacitance 165 may be referred to as $C_{SG}$. Similarly, this configuration creates capacitance 170 between gate polysilicon material 160 and N-well 152. This N-well-to-gate capacitance 170 may be referred to as $C_{NWG}$. Likewise, this arrangement creates capacitance 175 between drain N-type diffusion area 185 and gate polysilicon material 160. This drain-to-gate capacitance 175 may be referred to as $C_{DG}$. This arrangement also creates capacitance 173 between N-well 152 and the P-well or substrate region 190, which may be referred to as $C_{NWPW}$. The total capacitance for the structure, therefore, may be the sum of the individual capacitive elements, or $C_{TOTAL}=C_{SG}+C_{NWG}+C_{DG}+C_{NWPW}$.

For the sake of clarity, one may think of the biased N-type diffusion areas 155 and 185, together with N-well 152, as forming one plate of a parallel plate capacitor. The gate polysilicon material 160 may be thought of as forming a second plate of the parallel plate capacitor. Decoupling capacitor 150 may offer a relatively high capacitance per unit area, as compared with some other fet configurations, but may allow yield losses if any gate oxide defects cause shorts between the two plates. Also, pin-holes or other defects in the oxide may result in undesirable gate oxide leakage currents.

Figure 2A:
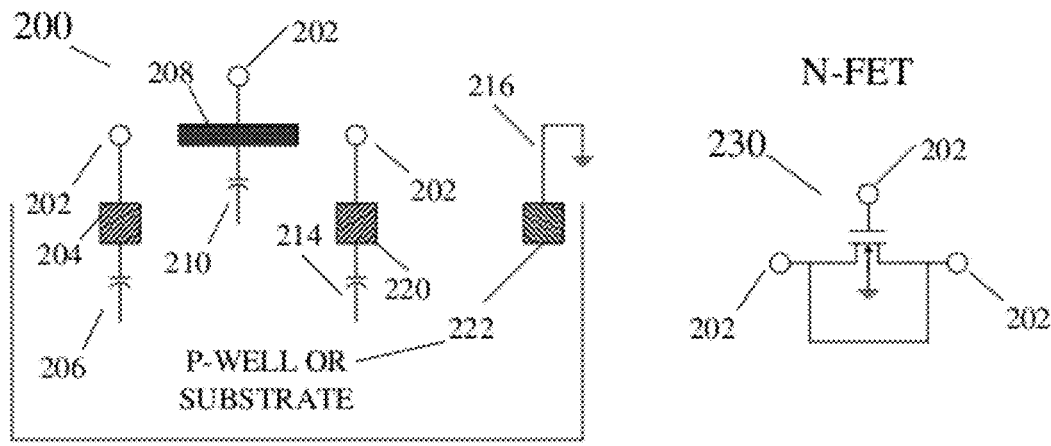
FIG. 2A depicts an alternate schematic for creating a capacitor from an N-fet in a P-well.
Figure 2B:
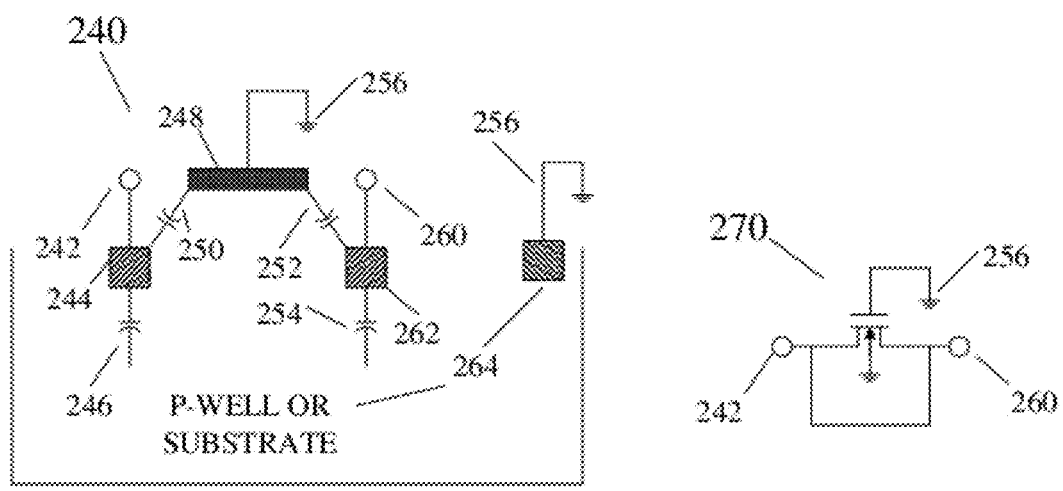
FIG. 2B depicts another alternative schematic for creating a capacitor from an N-fet in a P-well.

N-fet structures in N-wells are not the only configurations that may be used to create decoupling capacitance for an integrated circuit. FIG. 2A and FIG. 2B show alternate methods for creating thin oxide capacitive structures by using gate array N-fet structures in P-well or substrate materials. FIG. 2A illustrates an apparatus that may create a capacitor 200 from one N-fet section of a gate array cell, wherein an uncommitted base structure for creating an N-fet is located in a P-well. P-well region 222 may be connected to a ground connection 216. Source N-type diffusion 204 and drain N-type diffusion 220 may be coupled to power supply voltage $V_{DD}$ connection 202. Like the source N-type diffusion 204 and drain N-type diffusion 220, gate polysilicon 208 may be coupled with power supply voltage $V_{DD}$ connection 202. To the right of capacitor 200 is shown what may be a schematic representation 230 of the N-fet in a P-well capacitor 200.

While not shown for the sake of clarity, one should note that P-well region 222 actually surrounds source N-type diffusion 204 and drain N-type diffusion 220, which would serve as the channel material for the N-fet structure. For example, P-well region 222 fills the area below the transistor elements, similar to the manner P-well or substrate region 190 surrounds N-well 152 in FIG. 1D. This shorthand depiction is typical for FIGS. 1D through 3B.

When connected in the manner shown in FIG. 2A, the structure creates a capacitance 206 between the N-type diffusion 204 and P-well region 222. This capacitance 206 may be termed $C_{SPW}$. The connected structure also creates a capacitance 210 between gate polysilicon 208 material and P-well region 222. This capacitance 210 may be referred to as $C_{GPW}$. Similarly, between N-type diffusion 220 and P-well region 222, the connected structure creates capacitance 214, which may be referred to as $C_{DPW}$. The total capacitance for the capacitor 200 structure, in this instance, may be the sum of the individual capacitive elements, namely $C_{TOTAL}=C_{SPW}+C_{GPW}+C_{DPW}$.

Coupling gate polysilicon 208 with power supply voltage $V_{DD}$ connection 202 may provide greater amounts of capacitance than other similarly connected structures, but such a configuration may be susceptible to gate oxide leakage currents. Another configuration for creating a capacitor from a gate array N-fet structure situated in a P-well is depicted in FIG. 2B, wherein gate polysilicon 248 is instead connected to ground 256. This configuration may have the benefits of minimizing the issues associated with gate oxide defects and reducing gate-to-body tunneling leakage. Similar to the configuration shown in FIG. 2A, capacitor 240 has source N-type diffusion 244 and drain N-type diffusion 262 coupled with power supply voltage $V_{DD}$ by connections 242 and 260, respectively. Also similar to FIG. 2A, capacitor 240 has P-well material 264 coupled to ground 256. To the right of capacitor 240 is shown what may be a schematic representation 270 of this particular N-fet in a P-well capacitor 240.

When gate polysilicon 248 is instead connected to ground 256, as configured in FIG. 2B, the apparatus develops a capacitance 246 between source N-type diffusion 244 and P-well material 264. Likewise, the apparatus develops a capacitance 254 between drain N-type diffusion 262 and P-well material 264. The apparatus also develops capacitance 250 and 252 between gate polysilicon 248 and the N-type diffusion elements 244 and 262, respectively.

When configured in the manner depicted in FIG. 2B, capacitor 240 may have a total capacitance value ($C_{TOTAL}$) equal to the sum of capacitance 246 ($C_{SPW}$), capacitance 254 ($C_{DPW}$), capacitance 250 ($C_{SG}$), and capacitance 252 ($C_{DG}$). In other words, the total capacitance may be found by using the formula $C_{TOTAL}=C_{SPW}+C_{DPW}+C_{SG}+C_{DG}$.

As alluded to above, gate array N-fet structures in P-wells are one of the gate array configurations that may be used to create decoupling capacitance for an integrated circuit. Other gate array configurations that may be used to create capacitance may comprise P-fet structures situated in N-wells. FIG. 3A and FIG. 3B show two alternate methods for creating thin oxide capacitive structures utilizing gate array P-fet structures in N-wells.

FIG. 3A illustrates a capacitor 300, wherein an uncommitted gate array base structure for creating a P-fet is located in an N-well 306. N-well 306 is biased to $V_{DD}$ by way of power supply connection 320, coupled to N-well 306 using N-type diffusion material 324. Similarly, source P-type diffusion material 304 and drain P-type diffusion material 326 are coupled to $V_{DD}$ by way of power supply connections 302 and 322, respectively. P-fet gate polysilicon 308 and substrate 328 are connected to ground by way of ground connections 318 and 330, respectively. Such capacitor 300 may have an equivalent schematic representation 340, depicted to the right of capacitor 300 in FIG. 3A.

When configured in the manner depicted in FIG. 3A, capacitor 300 may have a total capacitance value ($C_{TOTAL}$) equal to the sum of capacitance 310 ($C_{SG}$), capacitance 314 ($C_{DG}$), capacitance 312 ($C_{NWG}$), and capacitance 316 ($C_{NWSX}$). In other words, the total capacitance may be determined by using the formula $C_{TOTAL}=C_{SG}+C_{DG}+C_{NWG}+C_{NWSX}$.

In an alternative embodiment, a P-fet structure situated in an N-well may have its gate polysilicon connected to $V_{DD}$, while the P-type diffusion materials for the drain and gates may be grounded. Such an arrangement for a capacitive structure 350 is shown in FIG. 3B. Again, P-fet components may be situated in an N-well 362, which may be biased to $V_{DD}$ with power supply connection 372 by way of N-type diffusion material 376. Gate polysilicon material 356 may also be biased to $V_{DD}$ with connection 364.

Source P-type diffusion material 354 and drain P-type diffusion material 378 may be grounded by grounding connections 352 and 374, respectively. P-well or substrate base material 380 may also be grounded with ground connection 382. Capacitive structure 350 may be considered to have an equivalent schematic 390, also depicted in FIG. 3B.

When connected as shown in FIG. 3B, capacitive structure 350 may have a total capacitance value ($C_{TOTAL}$) equal to the sum of capacitance 358 ($C_{GS}$), capacitance 366 ($C_{GD}$), capacitance 360 ($C_{SNW}$), capacitance 368 ($C_{DNW}$), and capacitance 370 ($C_{NWSX}$). In other words, the total capacitance for capacitive structure 350 may be determined by using the formula $C_{TOTAL}=C_{GS}+C_{GD}+C_{SNW}+C_{DNW}+C_{NWSX}$.

Obviously, capacitive structures may be created from gate arrays in a variety of different ways, including ways not already noted. Such capacitive structures may well come within the boundaries of the methods discussed herein for the various embodiments. Additionally, while the aforementioned descriptions of the various apparatuses may show separate or independent connections to power supply voltages and power supply grounds, the power supply connections may actually be derived from the same power supply source. For example, while FIG. 3B depicts three separate power supply ground connections, namely ground connections 352, 374, and 382, all three ground connections may actually be derived from a single common metal connection. Similarly, the two power supply voltage connections, namely $V_{DD}$ with power supply connection 372 and $V_{DD}$ connection 364, may both be derived from a common metal connection.

Figure 4:
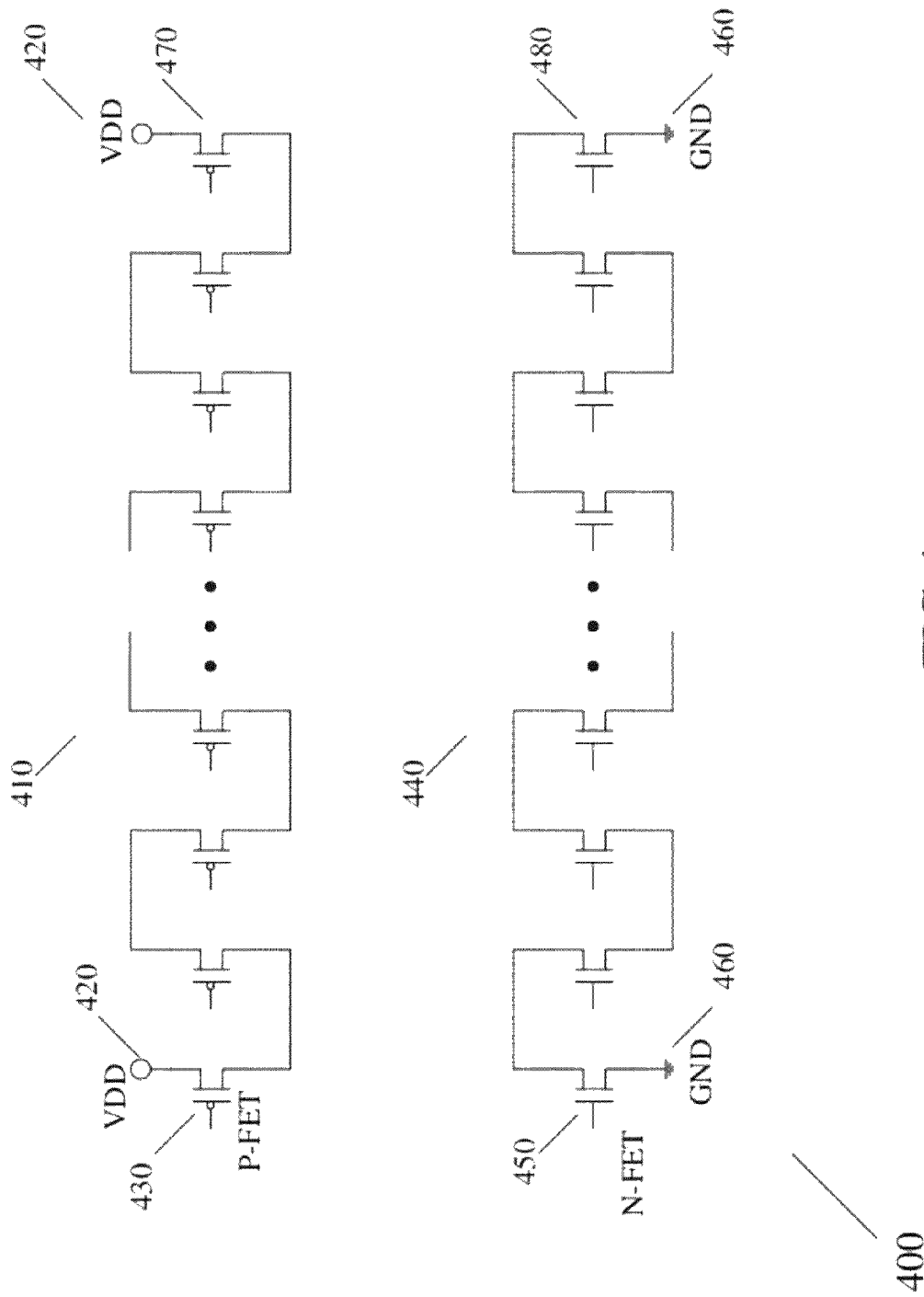
FIG. 4 shows a schematic for a gate array that may be configured to create capacitance for an integrated circuit.

Turning now to the next figure, FIG. 4 shows a schematic for an uncommitted or unconfigured gate array 400 that may be configured to deliver capacitance in numerous embodiments or, alternatively, may be configured to provide various logic gates. The uncommitted gate array 400 may comprise a plethora of basic circuit components, such as P-fets and N-fets. In FIG. 4, gate array 400 comprises a plethora of P-fets 410 and a plethora of N-fets 440. The number of P-fets and N-fets may vary greatly in different embodiments. FIG. 4 shows relatively few P-fets and N-fets to aid in clearly describing and conveying the operation of various embodiments.

Gate arrays may have functionally isolated, or totally independent, elements. Alternatively, gate arrays may contain functionally committed, or dependent, elements. Stated differently, gate arrays may affect or be affected by adjacent cells, depending on the particular gate array cell configurations. Gate array 400 contains P-Fet 430 and Pfet 470, which may be physically located near the cell boundary for gate array 400. Similarly, gate array 400 contains N-fet 450 and N-fet 480, which may also be located near the gate array cell boundary. While gate array 400 may be uncommitted, these four transistors may have functionally committed elements, in that each of them may have pre-defined or dedicated connections to adjacent circuit elements. Note that both P-fet 430 and P-fet 470 are connected to a power supply $V_{DD}$ 420. Likewise, both N-fet 450 and N-fet 480 are connected to a power supply ground 460.

Figure 5:
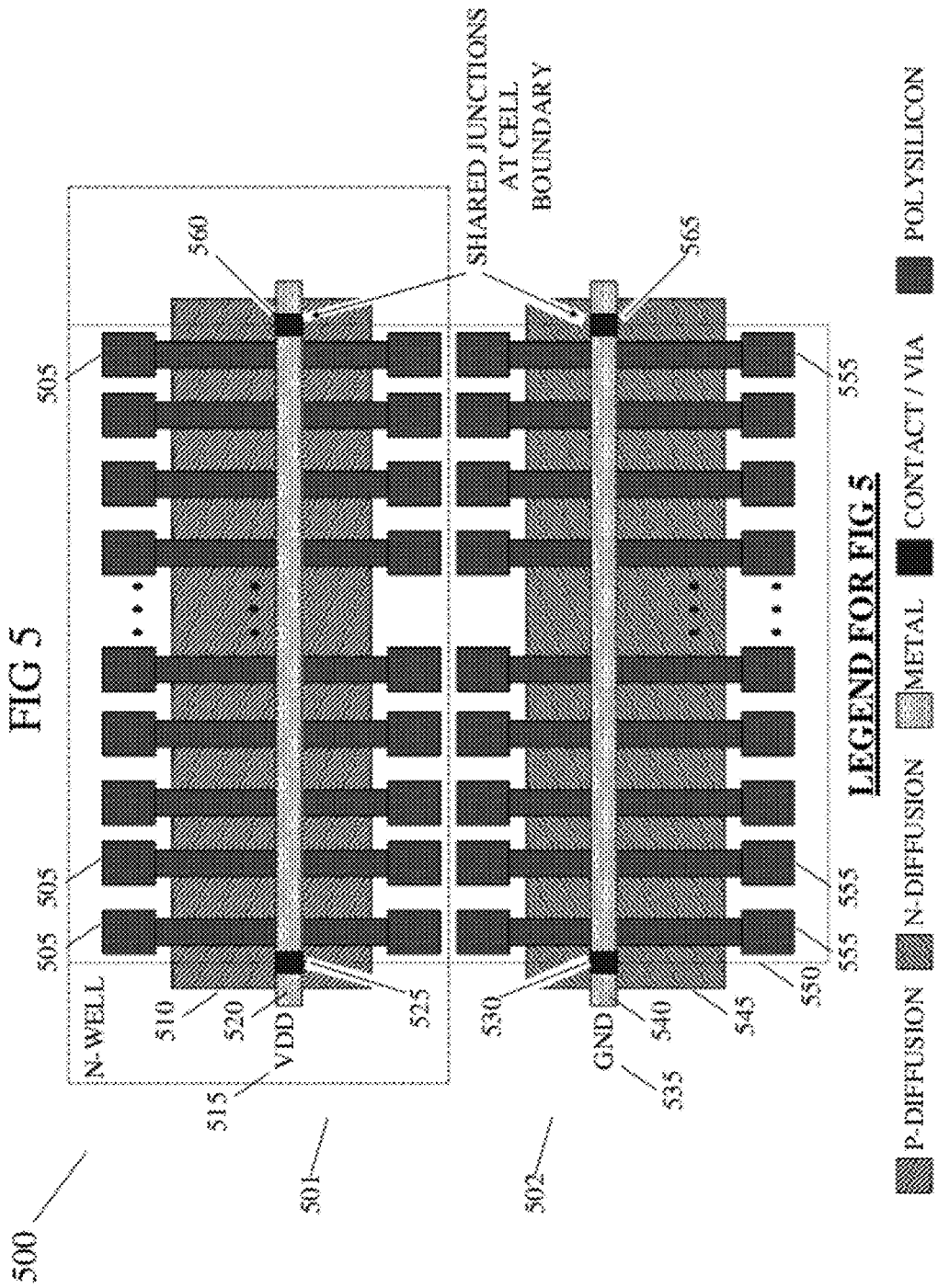
FIG. 5 illustrates a physical arrangement of gate array elements that may be configured to create capacitance.

FIG. 5 shows what may be the physical layout corresponding to the schematic for gate array 400, shown in FIG. 4. More specifically, FIG. 5 depicts the physical components for an unconfigured gate array 500, comprising a collection of P-fets in an N-well 501 and a collection of N-fets in a P-well 502. For the collection of P-fets in an N-well 501, there is a P-diffusion region 510, numerous polysilicon gate structures 505, and a metal rail 520, connected to a $V_{DD}$ power supply rail 515, traversing the P-diffusion region 510 and polysilicon gate structures 505. The metal rail 520 supplies power to the P-diffusion region 510 at the gate array cell 550 boundaries by way of contact 525 and contact 560.

Similar to the collection of P-fets in an N-well 501, the collection of N-fets in a P-well 502 comprise an N-diffusion region 545 situated or positioned under a collection of polysilicon gate structures 555. A metal rail 540 traverses the N-diffusion region 545 and the collection of polysilicon gate structures 555 and couples power supply ground 535 to the N-diffusion region 545 at the gate array cell 550 boundaries by way of contact 530 and contact 565.

As discussed and depicted in the schematic for gate array 400 of FIG. 4, gate array 500 depicted in FIG. 5 may have boundary P-fets and N-fets functionally committed, with dedicated connections to adjacent circuit elements. That is to say, contact 525, contact 560, contact 530, and contact 565 may comprise shared junctions, coupling the gate array cell 550 to adjacent cells. Gate array cells in alternative embodiments may not contain such shared junctions. Again, gate array 500 is an example gate array that may be used to create a capacitance structure in several embodiments, using BEOL techniques. In other words, a gate array similar to gate array 500 may be configured to create capacitance in an integrated circuit at a very late stage in the design process, such as after "final" design but before actual mass production of an integrated circuit device.

Note that in the several preceding paragraphs, FIG. 5 was described as depicting the physical components for an unconfigured gate array 500, comprising a collection of P-fets in an N-well 501 and a collection of N-fets in a P-well 502. While such a description may be accurate for various embodiments, the references to P-fets and N-fets may alternatively, and potentially more accurately, be described as diffusion volumes in a bulk or substrate. For example, the N-well material for the collection of P-fets in an N-well 501 may be more accurately described as an N-type diffusion volume created in a bulk material, or substrate, which may be P-well or a P-type diffusion volume. Also, the P-diffusion region 510 may be alternatively termed a P-type diffusion volume, positioned inside the N-well. Similarly, the collection of N-fets in a P-well 502 was described as comprising an N-diffusion region 545 in a base or substrate, the structures may alternatively be described as having an N-type diffusion volume located in a P-type diffusion volume. Also, while the unconfigured gate array 500 may be described as having a series of polysilicon gate structures 505 and a collection of polysilicon gate structures, these structures may alternatively be described as simply polysilicon materials. Such alternative descriptions may also be used in the discussions for FIG. 7 and FIG. 9, which follow.

Figure 6:
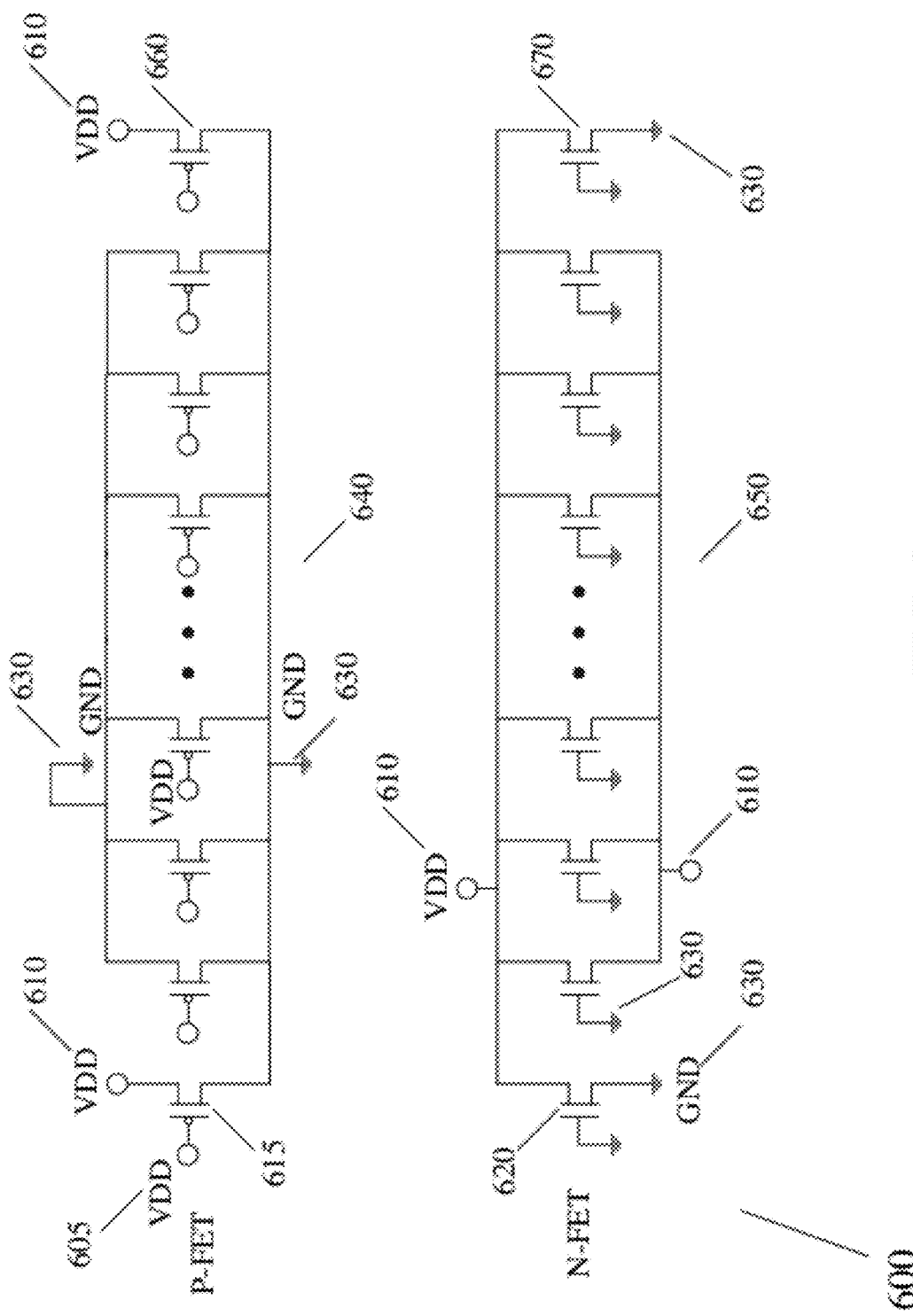
FIG. 6 shows a schematic of a capacitive structure comprising a collection of P-fets and a collection of N-fets that are isolated by a pair of P-fets and a pair of N-fets, respectively.

FIG. 6 illustrates a schematic representation of a gate array 600 configured as a capacitive device. In this embodiment, a collection of P-fets 640 and a collection of N-fets 650 are arranged in a manner that may reflect how they may appear in a corresponding physical layout of gate array 700, shown in FIG. 7. In gate array 600 the drain connections for boundary P-fet 615 and boundary P-fet 660 are coupled to power supply $V_{DD}$ 610. Likewise, the source connections for boundary N-fet 620 and boundary N-fet 670 are coupled to a power supply ground 630.

FIG. 6 further illustrates that the collection of P-fets 640 may all have their source and drain connections coupled to power supply ground 630, the exceptions being the boundary P-fets 615 and 660. Conversely, the gates for the collection of P-fets 640 are all connected to power supply $V_{DD}$ 610.

The collection of N-fets 650 may all have their source and drain connections coupled to power supply $V_{DD}$ 610, the exceptions again being boundary N-fet 620 and boundary N-fet 670. Conversely, the gates for the collection of N-fets 650 may all be coupled to power supply ground 630. Configuring the inside P-fets and N-fets in this manner may allow the device to store charges and function as a capacitive devices, similar to the configuration shown in FIG. 2B and FIG. 3B.

Capacitance for this gate array device may be derived from storing charges in the underlying N-diffusion and P-diffusion regions, or volumes. The charges are figuratively sandwiched between the transistor gates, which function as one plate of a capacitor held at one potential, while the transistor source and drain materials serve as the other capacitor plate, held at the opposite potential. Worth emphasis for this embodiment, the gate oxide region has a common potential between the gate and the underlying body, which may eliminate gate oxide defect induced leakage.

Generally, the boundary transistors connected as shown in FIG. 6 may serve to electrically isolate the gate array cell 600 from adjacent cells. For example, coupling the gates of the boundary P-fets 615 and 660 to power supply $V_{DD}$ 610 switches both P-fet 615 and P-fet 660 off and electrically isolates the remaining P-fets in the collection of P-fets 640. Similarly, coupling the gates of the boundary N-fets 620 and 670 to power supply ground 630 switches N-fet 620 and N-fet 670 off, isolating the remaining N-fets in the collection of N-fets 650. Connecting the boundary transistors in this manner may allow the other transistors in the gate array cell to be biased in the manner described above to help minimize or reduce yield losses resulting from gate oxide defects. To minimize or attenuate drain-to-source leakage associated with connected boundary devices, alternative embodiments may be employed.

Figure 7:
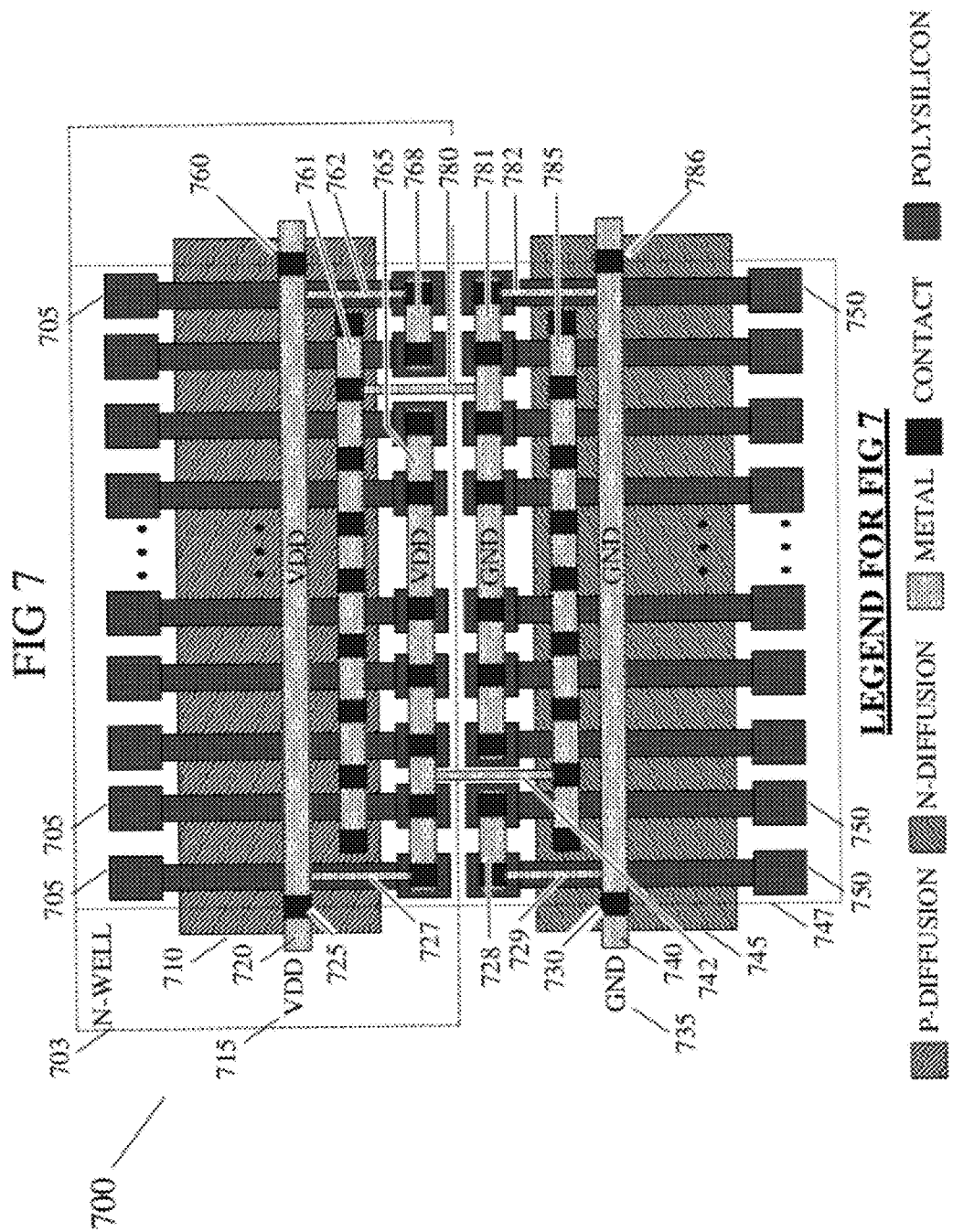
FIG. 7 illustrates a physical arrangement of a capacitive structure comprising a collection of P-fets and a collection of N-fets that are isolated by a pair of P-fets and a pair of N-fets, respectively.

FIG. 7 may depict a physical layout and arrangement, including metal layer interconnects, of the elements of gate array 600 shown in the schematic of FIG. 6. Similar to the components and arrangements shown for gate array 500 in FIG. 5, gate array 700 has a collection of polysilicon gate structures 705 above an N-well 703, wherein the N-well 703 surrounds the region around and below a P-diffusion area 710. Gate array 700 also has a collection of polysilicon gate structures 750 above a P-well, or substrate, and an N-diffusion region 745.

Gate array 700 may have a power supply rail voltage $V_{DD}$ 715 coupled with a power supply rail 720. Power supply rail 720 may traverse both the collection of polysilicon gate structures 705 and the underlying P-diffusion area 710. Additionally, power supply rail 720 carries the power supply rail voltage $V_{DD}$ 715 to the P-diffusion area 710 by way of contacts 725 and 760.

Gate array 700 may have a power supply ground rail 740 passing over the collection of polysilicon gate structures 750 and N-diffusion region 745, coupling power supply ground potential 735 to N-diffusion region 745 using contacts 730 and 786. Gate array 700 may also have the four contacts, namely contacts 725, 760, 730, and 786, located in close proximity to the boundary of gate array cell 747.

Unlike gate array 500, gate array 700 has been configured and fitted with numerous metal structures connecting various circuit elements within gate array 700, as well as routing the power supply rail voltage $V_{DD}$ 715 and power supply ground potential 735 to circuit elements. In particular, metal structures 727 and 762 may be connected with power supply rail 720 in order to couple the power supply rail voltage $V_{DD}$ 715 to the collection of polysilicon gate structures 705 by way of associated contacts. The collection of polysilicon gate structures 705 may be the gates for the collection of P-fets shown in FIG. 6.

Metal structures 729 and 782 may be connected to power supply ground rail 740, coupling power supply ground potential 735 to the collection of polysilicon gate structures 750. By way of vertical metal structure 780, metal structure 761 may be coupled to power supply ground potential 735 with portions of the P-diffusion region 710. In like fashion, metal structure 785 may be indirectly connected to power supply rail 720 by way of vertical metal structure 727 and vertical metal structure 742 in order to couple the power supply rail voltage $V_{DD}$ 715 to portions of the N-diffusion region 745. Stated in simple terms, additional metal structures or interconnects such as 727, 728, 729, 742, 761, 762, 765, 768, 780, 781, 782, and 785, may be added to an uncommitted gate array, similar to unconfigured gate array 500 depicted in FIG. 5, in order to create the capacitive devices shown in FIG. 2B and FIG. 3B. These additional metal layer interconnects may also be used to isolate the newly created capacitive devices similar to the isolation methods discussed for FIG. 6. Worth emphasizing, one may define select sections of metallic interconnect as having relatively narrow dimensions to act as fusible links should a short occur within a gate array decoupling capacitor personalization region, such as a short from $V_{DD}$ to ground. The embodiment of FIG. 7 contains vertical metal structures defined to have relatively narrow widths, namely metal structures 727, 729, 742, 762, 780, and 782. Other embodiments may not have such fusible links, with the vertical metal structures defined with different dimensions.

As illustrated in FIG. 7, one may increase the device capacitance by arranging power rails and/or metal structures near the device. For example, one may increase capacitance of the device by interleaving first metal layer structures coupled to power supply $V_{DD}$ and ground. In FIG. 7, power supply rail 720 couples the power supply rail voltage $V_{DD}$ 715 with metal structures 765, 768 and 785 by way of metal structures 727, 762 and 742. Similarly, power supply ground rail 740 couples power supply ground potential 735 to metal structures 728, 781, and 761 by way of metal structures 729, 782, and 780. The horizontal metal structures coupled to power supply rail voltage $V_{DD}$ 715 are each separated by horizontal metal structures coupled to power supply ground potential 735. For example, metal structure 761, coupled to power supply ground rail 740, separates power supply rail 720 and metal structures 765 and 768, all three coupled to power supply rail voltage $V_{DD}$ 715. In like fashion, metal structure 765, coupled to power supply rail voltage $V_{DD}$ 715, separates metal structures 761 and 781, both coupled to power supply ground potential 735. Interleaving, or alternating, metal structures in this fashion may increase capacitance of the device. Additionally, reducing the space between these horizontal metal structures and increasing the sidewall or lateral area may bolster the overall capacitance of the device.

Figure 8:
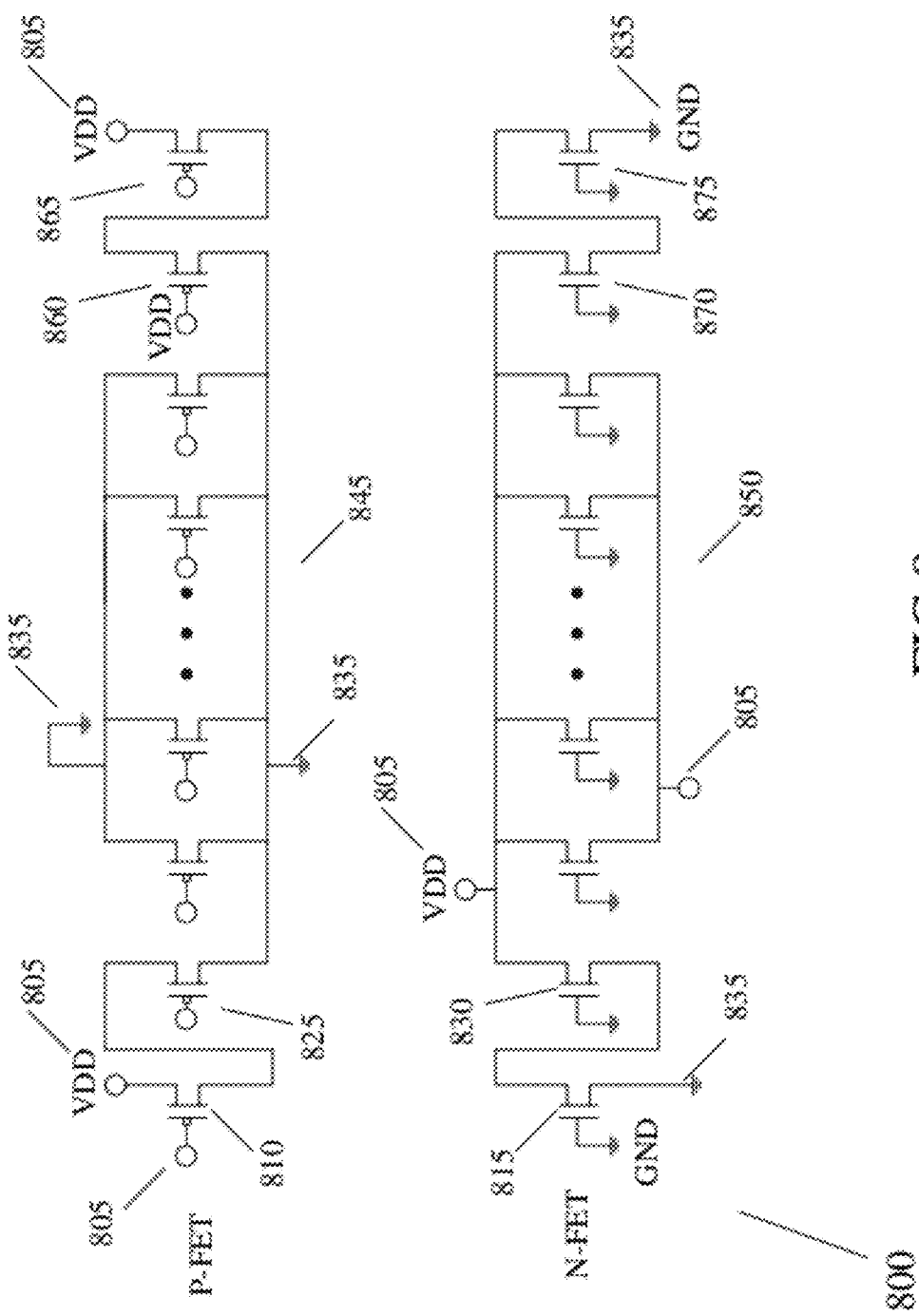
FIG. 8 shows a schematic of a capacitive structure comprising a collection of P-fets and a collection of N-fets that are isolated by two pairs of P-fets and two pairs of N-fets, respectively, each pair being connected in series.

Turning now to the next figure, FIG. 8 illustrates an alternative embodiment wherein a gate array 800 may be configured to provide capacitance while minimizing the effects of gate oxide defects and drain-to-source leakage. Stated generally, P-fet and N-fet structures near the gate array 800 boundaries may be connected in series and biased to an off state, which may significantly reduce drain-to-source leakage.

Stated more specifically, boundary P-fet 810 and adjacent P-fet 825 may be connected in series, with the source of boundary P-fet 810 coupled to the drain of P-fet 825 and the source of adjacent P-fet 825 coupled to a power supply ground connection 835. As stated before, the drain connection of boundary P-fet 810 may be connected to a power supply voltage $V_{DD}$ 805 due to the gate array 800 cell definition. To isolate this power supply potential from the rest of the gate array 800 collection of P-fets 845, the gate of boundary P-fet 810 and the gate of adjacent P-fet 825 may both be coupled to power supply voltage $V_{DD}$ 805. Coupling power supply voltage $V_{DD}$ 805 to the gates of boundary P-fet 810 and adjacent P-fet 825, which are connected in series, may turn off boundary P-fet 810 and adjacent P-fet 825 and significantly reduce the magnitude of drain-to-source leakage current flowing between the source of adjacent P-fet 825 and the drain of boundary P-fet 810.

In the same manner, opposite boundary P-fet 865 and opposite adjacent P-fet 860 may be connected in series and turned off by connecting the gates of both transistors to power supply voltage $V_{DD}$ 805. Connecting the transistors in this fashion may also help reduce the magnitude of drain to source leakage current flowing between the source of opposite adjacent P-fet 860 and the drain of opposite boundary P-fet 805.

Just as the magnitude of the drain to source leakage may be reduced for the collection of P-fets 845, the same may be accomplished for the gate array 800 collection of N-fets 850. The outer boundary N-fets, namely N-fet 815 and N-fet 875, may be connected in series with adjacent N-fets 830 and 870, respectively, and have all their gates connected to power supply ground connection 835. Connecting the N-fets in this manner will reduce the magnitude of the drain to source leakage current flowing between the source of N-fet 815 and the drain of N-fet 830, as well as the current flowing between the source of N-fet 875 and the drain of N-fet 870. In alternative embodiments, one may connect more than two P-fets and N-fets in series in an effort to reduce leakage current even further.

Similar to other embodiments, the collection of P-fets 845 and the collection of N-fets 850 may be configured as capacitive structures. In the case of the collection of P-fets 845, all of the P-fets not configured for boundary isolation may be have their sources and drains coupled to power supply ground connection 835 and their gates coupled to power supply voltage $V_{DD}$ 805. The collection of P-fets 845 used to create capacitance are all connected in parallel. Likewise, the collection of N-fets 850 used to create capacitance are also all connected in parallel. Capacitance is formed by the diffusion-to-body junction capacitances and the gate-to-source and gate-to-drain capacitances.

Figure 9:
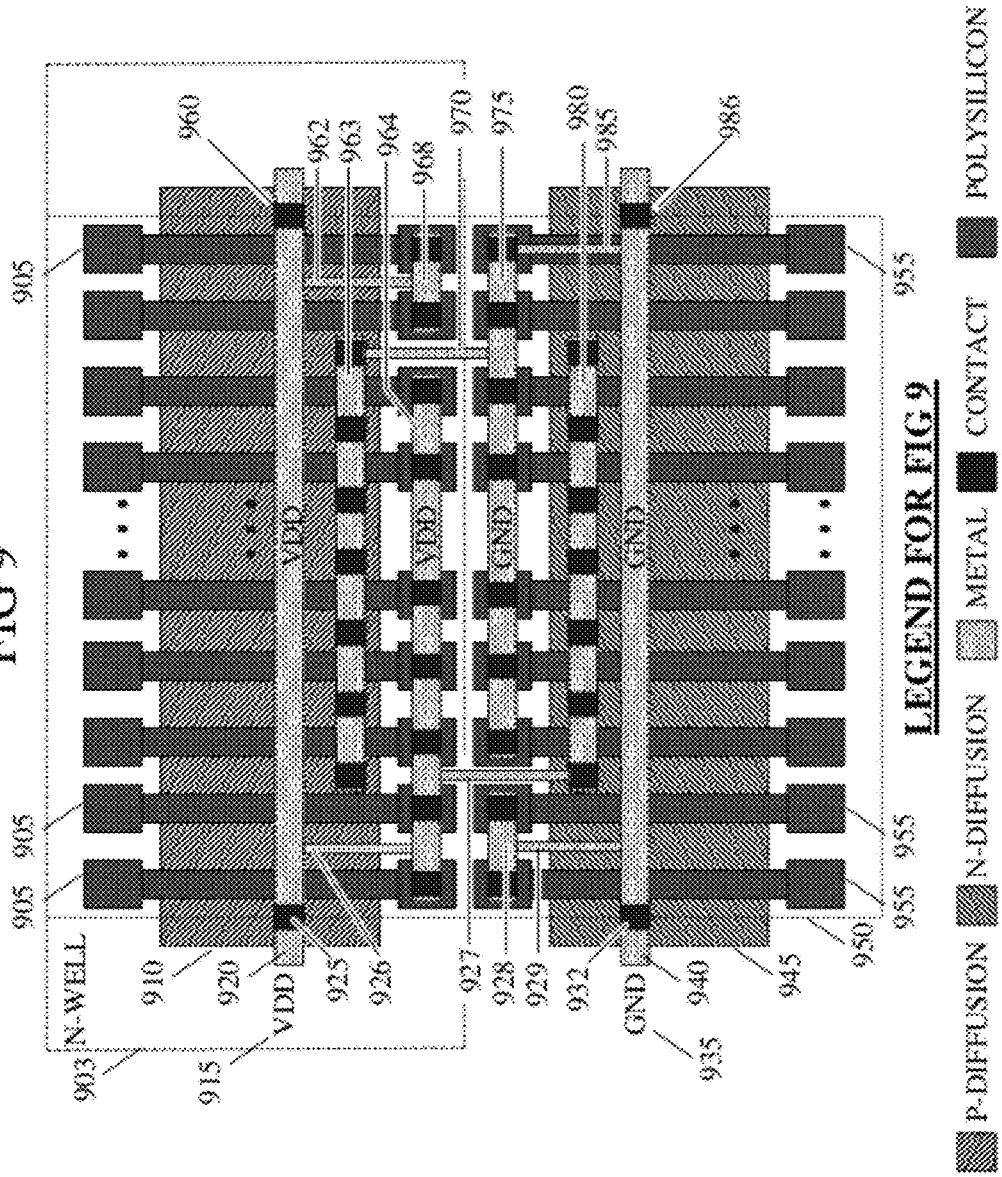
FIG. 9 illustrates a physical arrangement of a capacitive structure comprising a collection of P-fets and a collection of N-fets that are isolated by two pairs of P-fets and two pairs of N-fets, respectively, each pair being connected in series.

A physical implementation of the gate array 800 on a semiconductor substrate may be configured similar to the array shown in FIG. 9. FIG. 9 illustrates one physical arrangement, or configuration, of metal layers and contacts that may be used to connect the various components to form a capacitive apparatus like the gate array 800 shown in FIG. 8. FIG. 9 depicts a gate array cell 950 comprising a collection of polysilicon gate structures 955 positioned over an N-diffusion region 945 and a collection of polysilicon gate structures 905 positioned over a P-diffusion region 910 and N-well 903. A power supply rail 920 may cross the collection of polysilicon gate structures 905 and run parallel with the P-diffusion region 910, supplying power supply voltage $V_{DD}$ 915 to the P-diffusion region 910 boundaries, through boundary contact 925 and boundary contact 960, and other areas where power supply voltage $V_{DD}$ 915 may be needed.

Conversely, a ground supply rail 940 may cross the collection of polysilicon gate structures 955 and run parallel with the N-diffusion region 945, supplying power supply ground 935 to the N-diffusion region 945, by boundary contact 932 and boundary contact 986, as well as other areas requiring power supply ground 935. As depicted in FIG. 9, additional metal interconnects may be added to transform an uncommitted gate array into a capacitive apparatus, like the embodiment shown in FIG. 8.

By examining FIG. 9 and referring back to FIG. 8, one may see that a first metal interconnect 926 and a second metal interconnect 962 may be added to couple power supply voltage $V_{DD}$ 915, through a number of contacts, to the collection of polysilicon gate structures 905, which are the P-fet gates of gate array cell 950. Similarly, a third metal interconnect 929 and a fourth metal interconnect 985 may be added to couple power supply ground 935, through a number of contacts, to the collection of polysilicon gate structures 955, which are the N-fet gates of gate array cell 950. Referring back to FIG. 8, these connections may provide the connections for power supply voltage $V_{DD}$ 805 to the gates of the collection of P-fets 845. Likewise, these connections may create the numerous power supply ground connections 835 coupled to the gates of the collection of N-fets 850.

Vertical metal interconnect 970 may be added to couple power supply ground 935 to the P-fet sources and drains in the P-diffusion region 910. Likewise, vertical metal interconnect 927 may be added to couple power supply voltage $V_{DD}$ 915 to metal structure 980 and the associated N-fet sources and drains in the N-diffusion region 945. Referring back to FIG. 8, these ground and source connections may correspond to power supply ground connections 835 for the collection of P-fets 845 and power supply voltage $V_{DD}$ 805 connections for the collection of N-fets 850, respectively.

As noted for the metallurgical connections in FIG. 7, one should also note that select sections of the metallic interconnect may be defined to have minimum wire widths which may act as fusible links should a $V_{DD}$ to ground short should occur within the gate array decoupling capacitor personalization region. In the embodiment of FIG. 9, vertical sections of metal 926, 927, 929, 962, 970, and 985 have been defined with minimum wire widths.

As was noted for the metallurgical arrangement of FIG. 7, one may increase overall device capacitance by interleaving metal structures carrying different voltage potentials. In FIG. 9, metal structures coupled to power supply voltage $V_{DD}$ 915, namely metal structures 920, 964, 968, and 980, are separated by interleaving metal structures 963, 928, 975, and 940, which are coupled to power supply ground 935. The spacing between these metal structures may generally be decreased in order to increase the sidewall or lateral capacitance and bolster the overall decoupling of this gate array capacitive apparatus.

Figure 10:
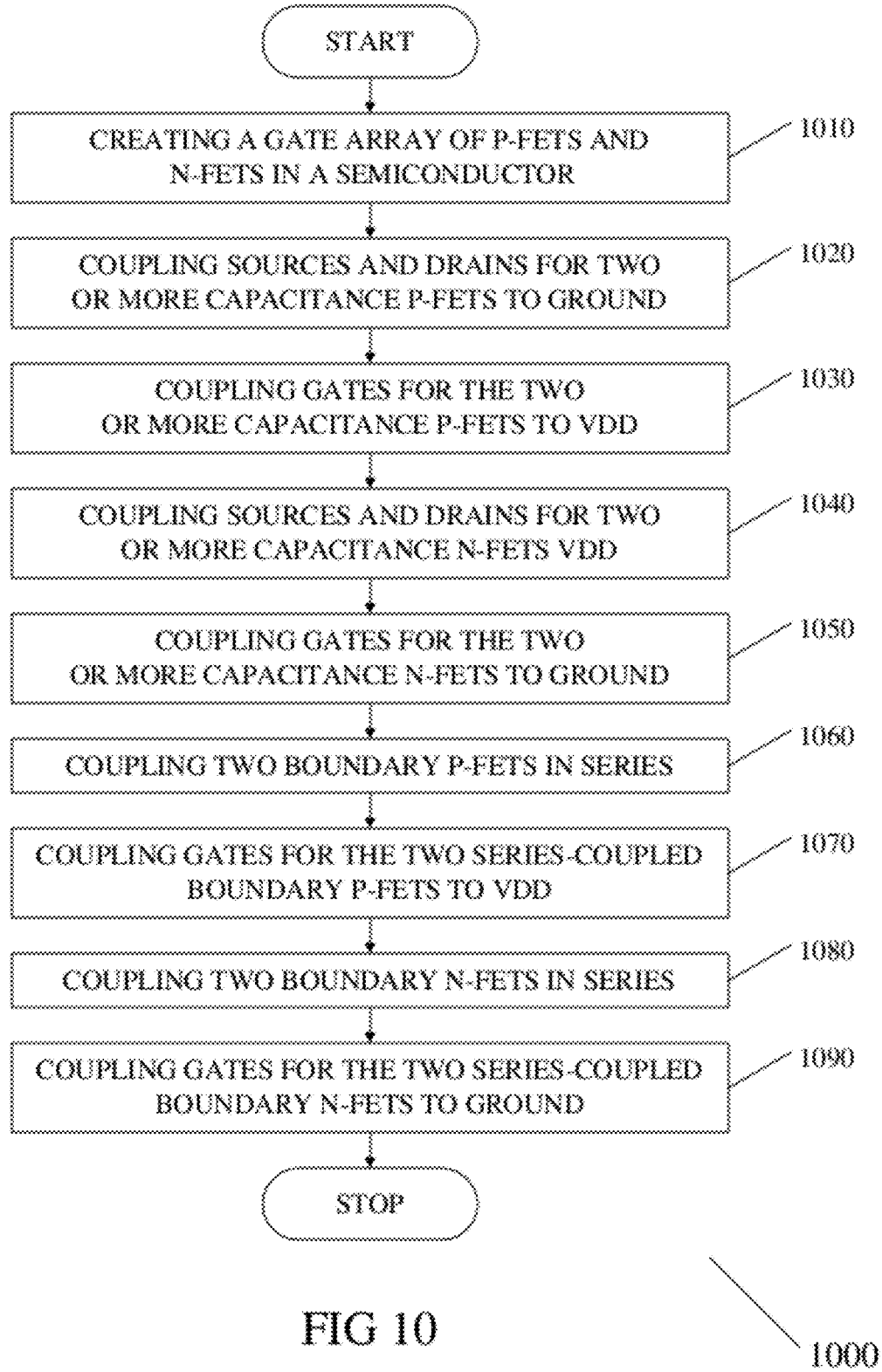
FIG. 10 depicts a flowchart of a method for creating capacitance from N-fets and P-fets in a gate array structure.

FIG. 10 depicts a flowchart 1000 of an embodiment to form a capacitive apparatus in a semiconductor substrate for an integrated circuit by arranging elements of a gate array. Flowchart 1000 begins with creating a gate array containing a plurality of P-fets and a plurality of N-fets in a semiconductor design (element 1010). In different embodiments, the gate array may contain a variety of different circuit elements and combinations of those elements. For example, the gate array may only contain a number of N-fets, without any P-fets. Conversely, in other embodiments, the gate array may only contain a number of P-fets, without any N-fets. Additionally, the type of P-fets and N-fets may vary in different embodiments. For example, the gate array in some embodiments may comprise N-fets in one or more P-wells. The gate array may also comprise elements other than simple N-fets and P-fets. For example, the structure may contain more complex elements, such as NAND gates. However, for the sake of clarity and understanding in this description, one may assume that the gate array selected for illustrating FIG. 10 has a collection of P-fets located in an N-well and a collection of N-fets located in a P-well.

After creating the gate array containing the plurality of P-fets and the plurality of N-fets (element 1010), the sources and the drains for two or more P-fets in the gate array may be coupled to a ground potential of a power supply (element 1020) and the gates of the P-fets may be coupled to a positive voltage of the power supply (element 1030), to create a capacitive apparatus. Since these two or more P-fets may be used to store electrical energy, they may be referred to as capacitance P-fets. In alternative embodiments, capacitance may be created from different P-fet configurations. For example, instead of coupling the sources and the drains of the P-fets to ground, they may instead be coupled to the positive power supply voltage while the P-fet gates are coupled to ground. The method of arranging and connecting the structure elements may depend on a variety of factors, such as the type of gate array structures available or the magnitude of capacitance needed.

Analogous to connecting P-fet elements for capacitance, N-fets may be connected for capacitance. The sources and the drains for two or more N-fets in the gate array may be coupled to the positive voltage of the power supply (element 1040), while the gates for the two or more N-fets may be coupled to the ground potential of the power supply (element 1050) to create a capacitive apparatus. Similar to the different ways P-fets may be configured for capacitance, in alternative embodiments the N-fets may also be configured differently. For example, one may couple the N-fet gates, sources, and drains with the positive voltage of the power supply while grounding the associated P-well, to create capacitance.

Depending on the gate array configuration used, a circuit designer may isolate the P-fet and N-fet capacitive apparatuses from the rest of the circuit. Such a measure may be necessary or desirable to reduce the effects of leakage currents when, for example, the gate array cell has functionally committed circuit elements that facilitate rapid circuit design, such as predefined routing of power supply voltage and ground rails that may be preconfigured to connect with diffusion materials. The capacitance P-fets in the gate array may be isolated from the rest of the circuit by coupling two boundary P-fets in series (element 1060) and reverse biasing the P-fets by coupling the gates of the two boundary P-fets to VDD (element 1070). These P-fets used for isolation may be referred to as boundary P-fets, because the boundary P-fets may be located separately from the capacitance P-fets, yet coupled to the capacitance P-fets via a common source connection.

In an alternative embodiment, a single reverse-biased boundary P-fet may be used to isolate the capacitance P-fets. In other embodiments, three or more series-connected boundary P-fets may be reverse-biased to isolate the capacitance P-fets. In further embodiments, various combinations of single and multiple series connected boundary P-fets may be coupled on each boundary of the capacitance P-fets to isolate the capacitance structure.

The capacitance N-fets in the gate array may be isolated from the rest of the circuit by coupling two boundary N-fets in series (element 1080) and reverse biasing the N-fets (element 1090) by coupling the gates of the boundary N-fets to ground. Similar to the boundary P-fets, these boundary N-fets may be located separately from the capacitance N-fets and still be coupled to the capacitance N-fets via a common drain connection. In different embodiments, various combinations of single and multiple series connected boundary N-fets may be coupled to the capacitance N-fets to isolate the capacitance structure.

Figure 11:
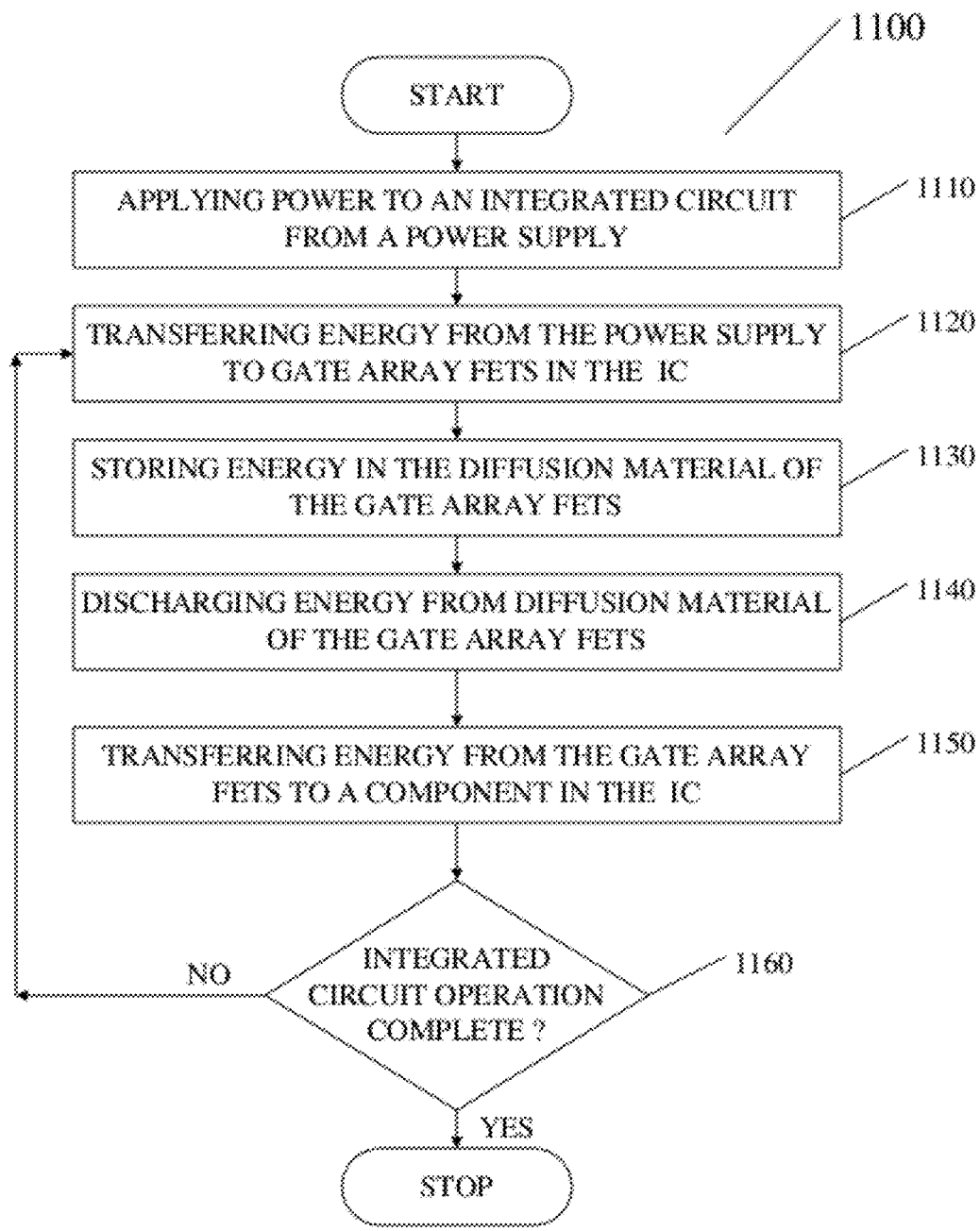
FIG. 11 depicts a flowchart explaining a process of how field effect transistors may be connected for storing and discharging energy in an integrated circuit.

FIG. 11 depicts a flowchart 1100 illustrating a process of coupling field effect transistors in such a manner to store and discharge electrical energy in an integrated circuit. The process begins by applying power to an integrated circuit from a power supply (element 1110). After applying power to the IC, energy may be transferred from the power supply to gate array FETs configured as a capacitive apparatus (element 1120). The number of FET structures used to create capacitance for the circuit may vary from one FET structure to numerous structures. Additionally, the FET structures may be N-fets, P-fets, or combinations of both N-fets and P-fets. In some embodiments the FETs may be N-fets, with the sources and the drains being coupled to a positive potential of the integrated circuit power supply and the gates being grounded. In some embodiments, the FETS may be P-fets with the sources and drains coupled to ground, while the gates of the P-fets are coupled to the positive potential.

The process of FIG. 11 continues by storing energy in the diffusion material of the gate array FETs (element 1130). In various embodiments, this storing of energy in the diffusion material of the FET structure may occur during a period the integrated circuit is temporarily in steady state, or when the integrated circuit is operating at a reduced frequency. The FET capacitance structure may discharge or relinquish energy stored in the structure (element 1140) and transfer the discharged energy to a different integrated circuit component or device (element 1150). In various embodiments, such discharge of stored energy may occur during transitional periods or periods when the integrated circuit operates at increased rates, which consume more energy. For example, the FET capacitance structure may discharge energy to an adjacent memory module when the integrated circuit temporarily operates at an increased frequency. This process of using the gate array FET capacitance structure to store and discharge energy may continue as long as the IC continues to operate (element 1160).

It will be apparent to those skilled in the art having the benefit of this disclosure that the present invention contemplates methods and apparatuses for creating capacitance structures in a semiconductor substrate of an integrated circuit, with reduced issues of gate oxide defects and leakage currents. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Further, embodiments may achieve multiple objectives but not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
 a plurality of field effect transistors in a semiconductor substrate, wherein the plurality of field effect transistors comprise a gate array of an integrated circuit;
 a source and a drain coupled to a metal trace for a first voltage, wherein the source and the drain are of a first transistor in the plurality of field effect transistors;
 a gate of the first transistor coupled to a metal trace for a second voltage; and
 a channel region of the first transistor coupled to the metal trace for the second voltage,
 wherein the coupling of the source and the drain to the metal trace for the first voltage and the coupling of the gate and the channel region to the metal trace for the second voltage enable the first transistor to function as a capacitor for the integrated circuit.

2. The apparatus of claim 1, wherein the plurality of field effect transistors are P-type field effect transistors, the first voltage being negative relative to the second voltage.

3. The apparatus of claim 2, further comprising a second drain and a second gate of a boundary transistor coupled to the metal trace for the second voltage, and a second source of the boundary transistor coupled to the metal trace for the first voltage, to electrically isolate the capacitive device from an external integrated circuit.

4. The apparatus of claim 2, further comprising a second drain and a second gate of a first boundary transistor coupled to the metal trace for the second voltage, a second source of the first boundary transistor coupled to a third drain of a second boundary transistor, a third gate of the second boundary transistor coupled to the metal trace for the second voltage, and a third source of the second boundary transistor coupled to the metal trace for the first voltage.

5. The apparatus of claim 1, wherein the plurality of field effect transistors are N-type field effect transistors, the first voltage being positive relative to the second voltage.

6. The apparatus of claim 5, further comprising a second source and a second gate of a boundary transistor coupled to the metal trace for the second voltage, and a second drain of the boundary transistor coupled to the metal trace for the first voltage, to electrically isolate the capacitive device from an external integrated circuit.

7. The apparatus of claim 5, further comprising a second source and a second gate of a first boundary transistor coupled to the metal trace for the second voltage, a second drain of the first boundary transistor coupled to a third source of a second boundary transistor, a third gate of the second boundary transistor coupled to the metal trace for the second voltage, and a third drain of the second boundary transistor coupled to the metal trace for the first voltage.

8. The apparatus of claim 1, wherein the capacitor for the integrated circuit comprises a decoupling capacitor.

9. A system, comprising:
 a processor formed in a semiconductor substrate, wherein the processor is coupled with random access memory;
 a plurality of field effect transistors in the semiconductor substrate, wherein the plurality of field effect transistors comprise a gate array of an integrated circuit;
 a source and a drain coupled to a metal trace for a first voltage, wherein the source and the drain are of a first transistor in the plurality of field effect transistors;
 a gate of the first transistor coupled to a metal trace for a second voltage; and
 a channel region of the first transistor coupled to the metal trace for the second voltage,
 wherein the coupling of the source and the drain to the metal trace for the first voltage and the coupling of the gate and the channel region to the metal trace for the second voltage enable the first transistor to function as a capacitor for the integrated circuit.

10. The system of claim 9, wherein the plurality of field effect transistors are P-type field effect transistors, the first voltage being negative relative to the second voltage.

11. The system of claim 10, further comprising a second drain and a second gate of a boundary transistor coupled to the metal trace for the second voltage, and a second source of the boundary transistor coupled to the metal trace for the first voltage, to electrically isolate the capacitive device from an external integrated circuit.

12. The system of claim 10, further comprising a second drain and a second gate of a first boundary transistor coupled to the metal trace for the second voltage, a second source of the first boundary transistor coupled to a third drain of a second boundary transistor, a third gate of the second boundary transistor coupled to the metal trace for the second voltage, and a third source of the second boundary transistor coupled to the metal trace for the first voltage.

13. The system of claim 9, wherein the plurality of field effect transistors are N-type field effect transistors, the first voltage being positive relative to the second voltage.

14. The system of claim 13, further comprising a second source and a second gate of a boundary transistor coupled to the metal trace for the second voltage, and a second drain of the boundary transistor coupled to the metal trace for the first voltage, to electrically isolate the capacitive device from an external integrated circuit.

15. The system of claim 13, further comprising a second source and a second gate of a first boundary transistor coupled to the metal trace for the second voltage, a second drain of the first boundary transistor coupled to a third source of a second boundary transistor, a third gate of the second boundary transistor coupled to the metal trace for the second voltage, and a third drain of the second boundary transistor coupled to the metal trace for the first voltage.

* * * * *